(12) United States Patent
Xu et al.

(10) Patent No.: US 12,107,054 B2
(45) Date of Patent: Oct. 1, 2024

(54) SEMICONDUCTOR PACKAGE, SEMICONDUCTOR DEVICE AND SHIELDING HOUSING OF SEMICONDUCTOR PACKAGE

(71) Applicant: Taiwan Semiconductor Manufacturing Company, Ltd., Hsinchu (TW)

(72) Inventors: Nuo Xu, San Jose, CA (US); Yuan-Hao Chang, Hsinchu (TW); Po-Sheng Lu, Hsinchu (TW); Zhiqiang Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/173,080

(22) Filed: Feb. 23, 2023

(65) Prior Publication Data
US 2023/0197633 A1     Jun. 22, 2023

Related U.S. Application Data

(63) Continuation of application No. 17/340,089, filed on Jun. 7, 2021, now Pat. No. 11,610,848.

(51) Int. Cl.
*H01L 23/552* (2006.01)
*H01L 23/00* (2006.01)
*H01L 25/065* (2023.01)

(52) U.S. Cl.
CPC .......... *H01L 23/552* (2013.01); *H01L 24/13* (2013.01); *H01L 25/0657* (2013.01); *H01L 2224/13005* (2013.01); *H01L 2225/06541* (2013.01); *H01L 2225/06565* (2013.01); *H01L 2225/06586* (2013.01); *H01L 2924/1435* (2013.01)

(58) Field of Classification Search
CPC .......... H01L 24/13; H01L 2224/13005; H01L 25/0657; H01L 2225/06541; H01L 2225/06565; H01L 2225/06586; H01L 2924/1435; H01L 23/552
USPC ........................................ 257/659
See application file for complete search history.

(56) References Cited

U.S. PATENT DOCUMENTS 10,347,826 B1 * 7/2019 Bhushan ............ H01L 23/31
2007/0197092 A1 * 8/2007 Tanaka ............ H01R 13/6581
439/607.01

(Continued)

*Primary Examiner* — Didarul A Mazumder
(74) *Attorney, Agent, or Firm* — JCIPRNET

(57) ABSTRACT

A semiconductor package, a semiconductor device and a shielding housing for a semiconductor package are provided. The semiconductor package includes a semiconductor chip having a first region and a second region beside the first region; and a shielding housing encasing the semiconductor chip, made of a magnetic permeable material, and including a first shielding plate, a second shielding plate opposite to the first shielding plate and a shielding wall extending between the first shielding plate and the second shielding plate. The first shielding plate has an opening exposing the first region and includes a raised portion surrounding the opening and a flat portion beside the raised portion and shielding the second region. A first distance from a level of the semiconductor chip to an outer surface of the raised portion is greater than a second distance from the level to an outer surface of the flat portion.

20 Claims, 9 Drawing Sheets

(56) References Cited

U.S. PATENT DOCUMENTS

| | | | |
|---|---|---|---|
| 2009/0184414 A1* | 7/2009 | Park | H01L 24/96 |
| | | | 257/E21.705 |
| 2012/0119338 A1* | 5/2012 | Watanabe | H01L 24/29 |
| | | | 257/659 |
| 2016/0254236 A1* | 9/2016 | Kim | H01L 23/3114 |
| | | | 257/659 |

* cited by examiner

SEMICONDUCTOR PACKAGE, SEMICONDUCTOR DEVICE AND SHIELDING HOUSING OF SEMICONDUCTOR PACKAGE

CROSS-REFERENCE TO RELATED APPLICATION

This is a continuation of a prior application Ser. No. 17/340,089, filed on Jun. 7, 2021, now allowed. The entirety of each of the above-mentioned patent applications is hereby incorporated by reference herein and made a part of this specification.

BACKGROUND

A magnetoresistive random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque random access memory (STT-RAM). An STT-RAM utilizes a magnetic tunneling junction (MTJ) written at least in part by a current driven through the MTJ. Another type of an MRAM is a spin orbit torque RAM (SOT-RAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
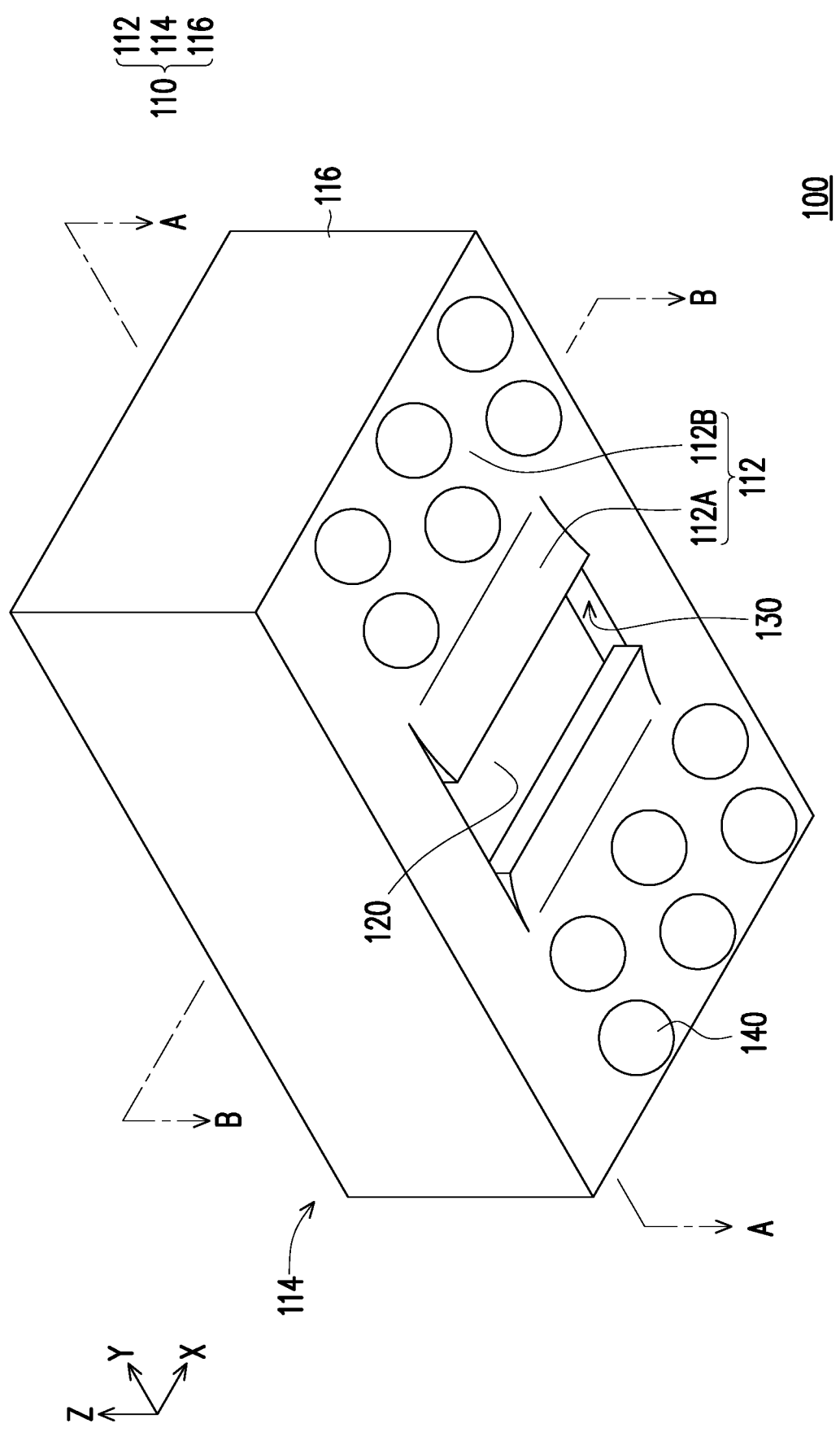
FIG. 1 schematically illustrates a front, right bottom perspective view of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
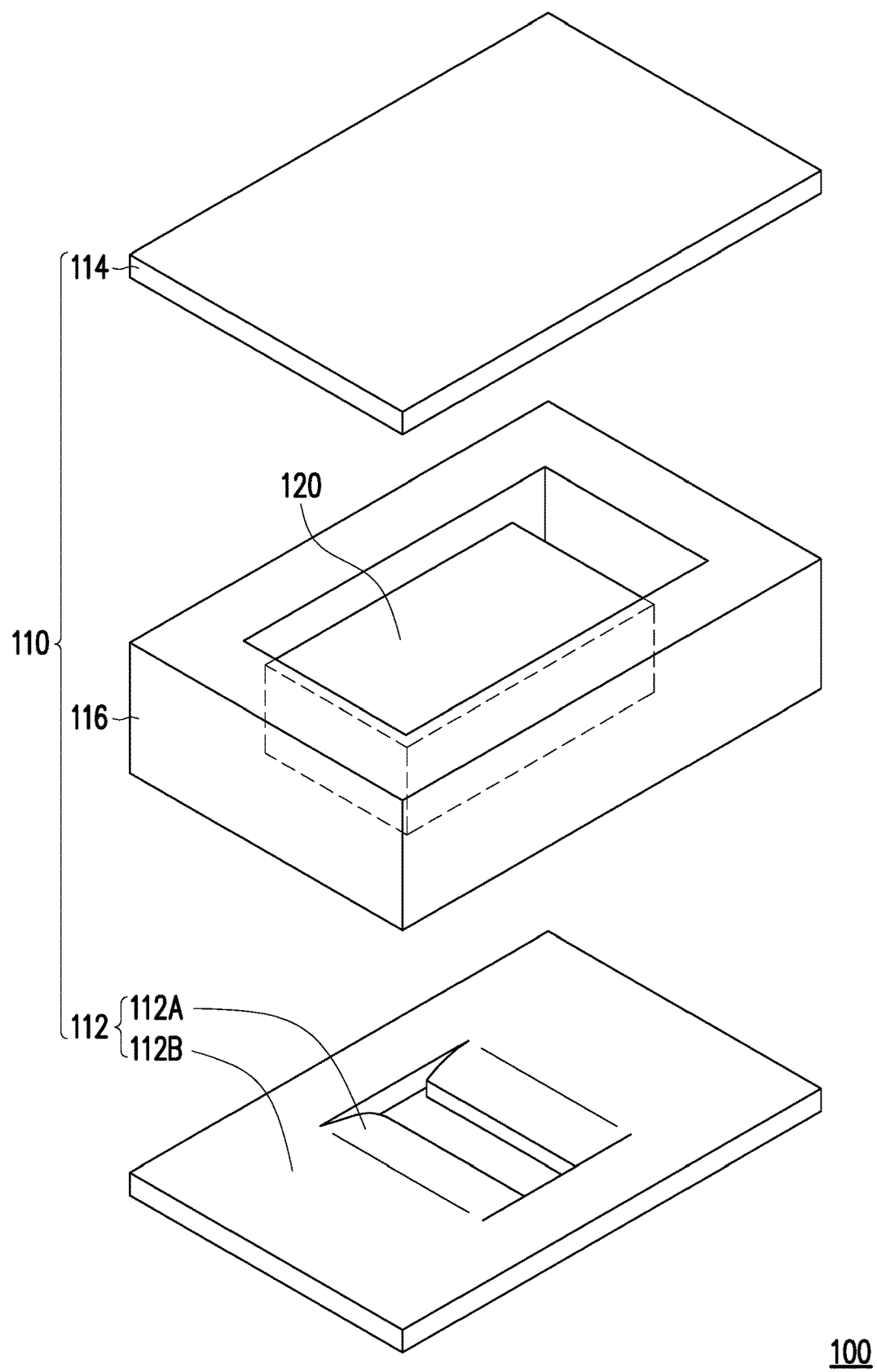
FIG. 2 schematically illustrates an explored view of a semiconductor package in accordance with some embodiments.

FIG. 1 schematically illustrates a front, right bottom perspective view of a semiconductor package in accordance with some embodiments and FIG. 2 schematically illustrates an explored view of a semiconductor package in accordance with some embodiments. Referring to FIGS. 1 and 2, a semiconductor package 100 includes a shielding housing 110 and a semiconductor chip 120 encased by the shielding housing 110. The shielding housing 110 includes a first shielding plate 112, a second shielding plate 114 opposite to the first shielding plate 112 and a shielding wall 116 extending between the first shielding plate 112 and the second shielding plate 114. The first shielding plate 112 and the second shielding plate 114 both extend in a X-Y plane and are spaced from each other in the Z direction, and the shielding wall 116 extend in the Z direction to connect the first shielding plate 112 and the second shielding plate 114. The first shielding plate 112 has an opening 130 exposing a portion of the semiconductor chip 120. Specifically, the first shielding plate 112 includes a raised portion 112A surrounding the opening 130 and a flat portion 112B beside the raised portion 112A. In the embodiment, the semiconductor package 100 further includes one or more bonding bump 140 disposed on the flat portion 112B of the first shielding plate 112 for bonding to another device or component.

As shown in FIG. 1, the raised portion 112A of the first shielding plate 112 can be curved to form a tilt structure surrounding the opening 130. The raised portion 112A is tilted so as to be protruded away from the semiconductor chip 120 while the flat portion 112B of the first shielding plate 112 is substantially a planar portion. The raised portion 112A can be arranged at two opposite sides of the opening 130, but the disclosure is not limited thereto. In the embodiment, the first shielding plate 112 and the second bonding plate 114 are formed of a square or rectangular shape and the shielding wall 116 continuously encircles the periphery of the first shielding plate 112 and the periphery of the second bonding plate 114. In alternative embodiments, the shape of the first shielding plate and the second shielding plate can be any other geometry based on different design.

The shielding housing 110 can be made of a magnetic permeable material. The first shielding plate 112, the second shielding plate 114 and the shielding wall 116 can be formed of a common material. In some embodiments, the shielding housing 110 can be made of a ferromagnetic material such as a ferromagnetic material having a magnetic permeability ($\mu$) of greater than 10 while the air or a vacuum space presents the magnetic permeability ($\mu$) of 1. For example, the shielding housing 110 can be made of a material selected from one or more of NiFe, CoFe, NiCuZn, MnZn, Si steel, or the like. The material of the shielding housing 110 can also have high saturation magnetization (Bs).

In some embodiments, the first shielding plate 112, the second shielding plate 114 and the shielding wall 116 can be formed as an integer. In alternative embodiments, the first shielding plate 112, the second shielding plate 114 and the shielding wall 116 can be formed as separate parts and can be attached to one another through metal bonding and/or adhering process. In further alternative embodiments, two of the first shielding plate 112, the second shielding plate 114 and the shielding wall 116 can be formed integrally as an integer piece and the other is attached to the integer piece through metal bonding or adhering. In some embodiments, each part of the shielding housing 110 can be fabricated through a 3D printing process, a metal punch process, or other suitable process.

The semiconductor chip 120 may include semiconductor components and required interconnect structures and/or contact pads. In some embodiments, the semiconductor components may include memory cells, such as MRAM cells or MRAM bits. An MRAM cell can include a MTJ, such as spin transfer torque magnetic tunnel junction (STT-MTJ) or the like. A quantity of the MRAM bits in the semiconductor chip 120 may be of a mega level or a giga level. The interconnect structures can be connected to the semiconductor components to build required electrical signal transmission paths and the contact pads can be connected to the interconnect structures for transmitting electrical signals to and from the semiconductor components. In the embodiment, the semiconductor chip is a MRAM chip, for example. In addition, the contact pads of the semiconductor chip 120 can be exposed by the opening 130 of the shielding housing 110 without being shielded by the shielding housing 110 and the semiconductor components such as the memory cells of the semiconductor chip 120 are positioned at the region that is shielded by the shielding housing 110.

The bonding bumps 140 can include solder balls that are disposed on the outer surface of the first shielding plate 112 of the shielding housing 110 and are positioned at the flat portion 112B. The bonding bumps 140 are used for bonding to an external component such as an interposer, a substrate, or the like.

The shielding housing 110 can form an envelope encasing the semiconductor chip 120. The magnetic field in the environment where the semiconductor package 100 is can be redirected by the shielding housing 110 in light of the magnetic permeability of the shielding housing 110 so that the environment magnetic field is prevented from directly passing through the semiconductor chip 120. In some embodiments, the effective magnetic field from the environment received by the semiconductor chip 120 with the shielding housing 110 may be reduced more than 50% of the environment magnetic field when compared to the semiconductor chip 120 without the shielding housing 110. Specifically, the semiconductor chip 120 encased by the shielding housing 110 can present less defects in the presence of an external magnetic field. For example, according to a simulation, one semiconductor chip 120 without encased by the shielding housing 110 may present a bit-error rate (BER) at a level of $10^{-6}$ while the same semiconductor chip 120 encased by the shielding housing 110 presents a BER at a level of $10^{-3}$. In other words, the encasing of the shielding housing 110 helps to improve the magnetic immunity of the semiconductor chip 120 to an external magnetic field so that optimized operation and yield can be achieved. In addition, with the shielding of the shielding housing 110, the requirement on the spin-transfer-torque (STT) efficiency of the MRAM bits in the semiconductor chip 120 that is defined by the ratio of thermal stability factor to switching current can be more flexible without limiting to a strict target when fabricating the MRAM bits, which helps to reducing the fabrication difficulty.

Figure 3:
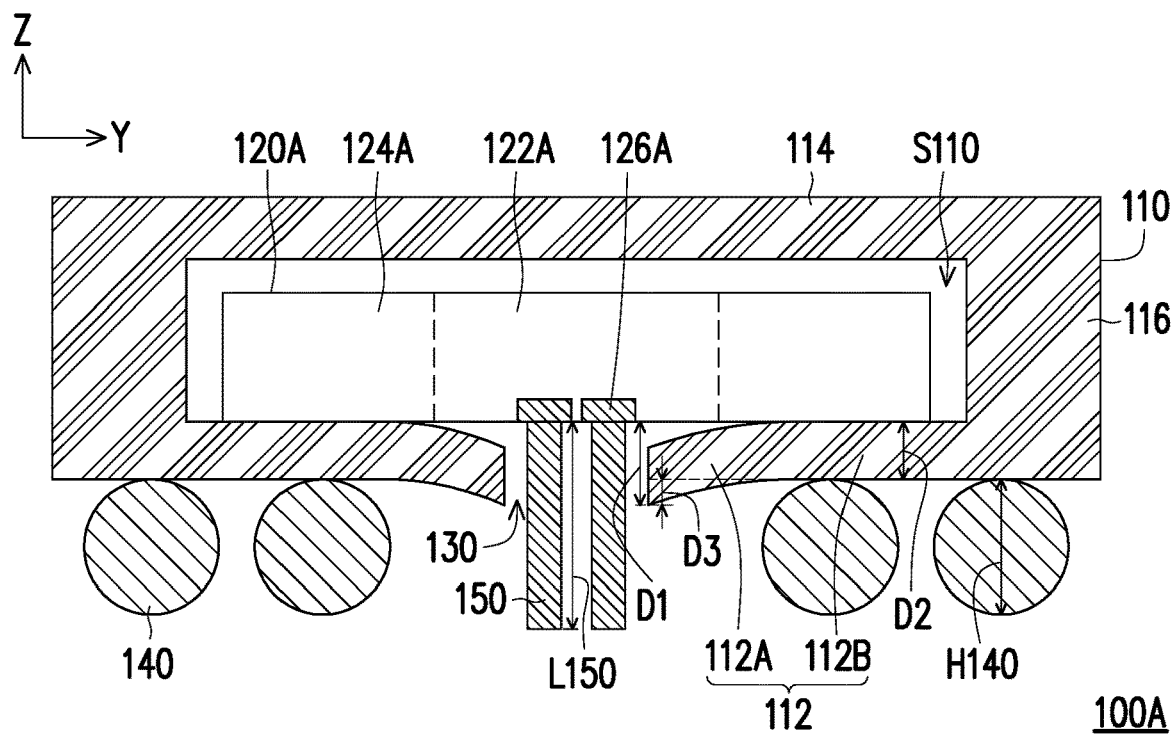
FIGS. 3 and 4 schematically illustrate various cross-sectional views of a semiconductor package in accordance with some embodiments.
Figure 4:
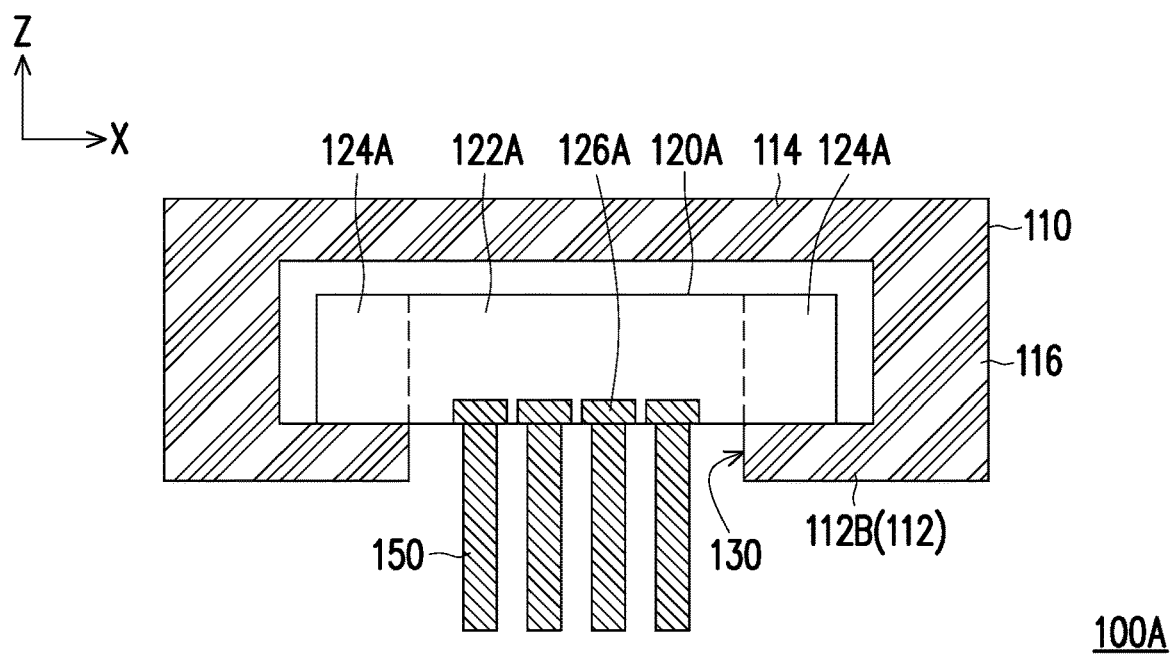

FIGS. 3 and 4 schematically illustrate various cross-sectional views of a semiconductor package in accordance with some embodiments. The cross-sectional view of FIG. 3 is corresponding to the line A-A in FIG. 1 and the cross-sectional view of FIG. 4 is corresponding to the line B-B in FIG. 1. In FIGS. 3 and 4, a semiconductor package 100A is similar to the semiconductor package 100 and some of the references numbers in the two embodiments are common since they indicate substantially the same components/elements. In the embodiment, a semiconductor package 100A includes a shielding housing 110 and a semiconductor chip 120A encased by the shielding housing 110. The shielding housing 110 in FIGS. 3 and 4 is substantially the same as the shielding housing 110 shown in FIGS. 1 and 2 and has an opening 130 that exposes a portion of the semiconductor chip 120A. The semiconductor package 100A further includes bonding bumps 140 that is, similar to the bonding bumps 140 in FIG. 1, disposed on the outer surface of the shielding housing 110. In addition, the semiconductor package 100A further includes one or more connectors 150 that is positioned in the opening 130 and connected to the semiconductor chip 120A.

The semiconductor chip 120A has a first region 122A and a second region 124A beside the first region 122A. According to FIGS. 3 and 4, the second region 120B surrounds all around the first region 122A, but the disclosure is not limited thereto. The semiconductor chip 120A includes I/O (input/output) pads 126A positioned in the first region 122A for connected to an external component/device. Specifically, the connectors 150 are connected to the I/O pads 126A, respectively. The semiconductor chip 120A can be an MRAM chip that includes MRAM bits (or MRAM cells, not shown) and required interconnect structures (not shown) formed in and/or on a semiconductor substrate. The I/O pads 126A are connected to the interconnect structure that connects to the MRAM bits. Specifically, the I/O pads 126A are positioned in the opening 130 without being shielded by the shielding housing 110 and the MRAM bits are positioned in the second region 124A that is shielded by the shielding housing 110.

The shielding housing 110 includes a first shielding plate 112, a second shielding plate 114 and a shielding wall 116. The first shielding plate 112 and the second shielding plate 114 are arranged opposite to each other in a bottom and top manner. The shielding wall 116 extends along the Z direction and connected between the first shielding plate 112 and the second shielding plate 114. The first shielding plate 112, the second shielding plate 114 and the shielding wall 116 encircle an internal space S110 of the shielding housing 110 so that the semiconductor chip 120A is positioned inside the internal space S110. In some embodiments, the semiconductor chip 120A can be attached to one or more side of the internal surface S110 of the shielding housing 110 through an adhesion such as epoxy or the like. In addition, a filling material such as epoxy or the like can fill the internal space S110 between the semiconductor chip 120A and the shielding housing 110, but the disclosure is not limited thereto.

The shielding housing 110 is made of a material with desirable magnetic permeability, for example, a material with the magnetic permeability greater than 10 while the air or a vacuum space presents the magnetic permeability of 1. In the embodiment, the first shielding plate 112 has an opening 130 while the second shielding plate 114 and the shielding wall 116 are solid parts without an opening/slot or the like. In the embodiment, the opening 130 exposes the first region 122A of the semiconductor chip 120A and the second region 122B of the semiconductor chip 120A is shielded by the shielding housing 110. Specifically, the firs shielding plate 112 includes a raised portion 112A surrounding the opening 130 and a flat portion 112B beside the raised portion 112A. The second region 124A of the semiconductor chip 120A is leant against or attached to the flat portion 112B of the first shielding plate 112 and the first region 122A of the semiconductor chip 120A is substantially located above the raised portion 112A and exposed by the opening 130.

The flat portion 112B is substantially flat to carry the semiconductor chip 120A and the raised portion 112A is tilt relative to the flat portion 112B. An outer surface of the raised portion 112A is further away from the semiconductor chip 120A than an outer surface of the flat portion 112B. For example, a first distance D1 from a level of the semiconductor chip 120A to the outer surface of the raised portion 112A is greater than a second distance D2 from the level of the semiconductor chip 120A to the outer surface of the flat portion 112B. In some embodiments, a difference between the first distance D1 and the second distance D2, i.e. the distance D3 between the outer surface of the raised portion 112A and the outer surface of the flat portion 112B can ranges from 200 μm to 5 mm.

When suffering to an external magnetic field existing in the environment, the shielding housing 110 receives and redirects the external magnetic field in light of the magnetic permeability so that the external magnetic field does not pass through the semiconductor chip 120A directly and is distributed in the shielding housing 110. In addition, the line of magnetic field distributed in the shielding housing 110 would spread at the terminal of the raised portion 112A since the magnetic permeable material is discontinued at the terminal of the raised portion 112A (i.e. the edge of the opening 130). In the embodiment, the terminal of the raised portion 112A directs toward a direction away from the semiconductor chip 120A so that the line of magnetic field is mostly directed outward the semiconductor chip 120A. Accordingly, the influence of the external magnetic field existing in the environment on the semiconductor chip 120A is mitigated. In some embodiments, the magnetic immunity of the semiconductor chip 120A is improved and the bit error rate of the semiconductor chip 120A due to the external magnetic field is reduced under the shielding of the shielding housing 110.

The raised portion 112A and the flat portion 112B can have similar or substantially identical thickness in the embodiment. The raised portion 112A is curved outwardly from the semiconductor chip 120A with respect to the flat portion 112B, so that the semiconductor chip 120A is spaced from the raised portion 112A of the first shielding plate 112. In some alternative embodiments, the thickness of the raised portion 112A can be different from the thickness of the flat portion 112B. The outer surface of the raised portion 112A keeps the third distance D3 from the outer surface of the flat portion 112B. In addition, the third distance D3 is smaller than the height H140 of each bonding bump 140 so that the raised portion 112A would not cause difficulty of boning the semiconductor package 100A onto another component. In some embodiments, the third distance D3 ranges from 200 μm to 5 mm, for example.

In the embodiment, each connector 150 is positioned inside the opening 130 and connected to the I/O pad 126A of the semiconductor chip 120A. The extending length L150 of the connector 150 is sufficient to connect to an external component or device. For example, the extending length L150 of the connector 150 is greater than the first distance D1. In some embodiments, the connector 150 is a bonding wire that has a linear shape. The extending length L150 of the connector 150 can be sufficient so that a distal terminal of the connector 150 away from the semiconductor chip 120 reaches a level as the bottom of the bonding bump 140. For example, the extending length L150 of the connector 150 can be not smaller than the sum of the second distance D2 and the height H140, but the disclosure is not limited thereto.

Referring to FIGS. 1, 3 and 4, the opening 130 of the shielding housing 110 can have a rectangular shape in the bottom view. The raised portion 112A is arranged at two opposite sides, the two elongate sides, along the line A-A of the opening 130. There is no raised portion 112A at the other two opposite sides, the two width sides along the line B-B of the opening 130. In some alternative embodiments, the raised portion 112A can further be arranged at the two opposite width sides along the line B-B of the opening 130, so that the raised portion 112A can be arranged along an enclosed loop to completely encircle the opening 130. In further alternative embodiments, the raised portion 112A can be arranged at the two opposite width sides and absent at the two opposite elongate sides. In addition, the opening 130 can have other shapes that are not disclosed in the disclosure.

Figure 5:
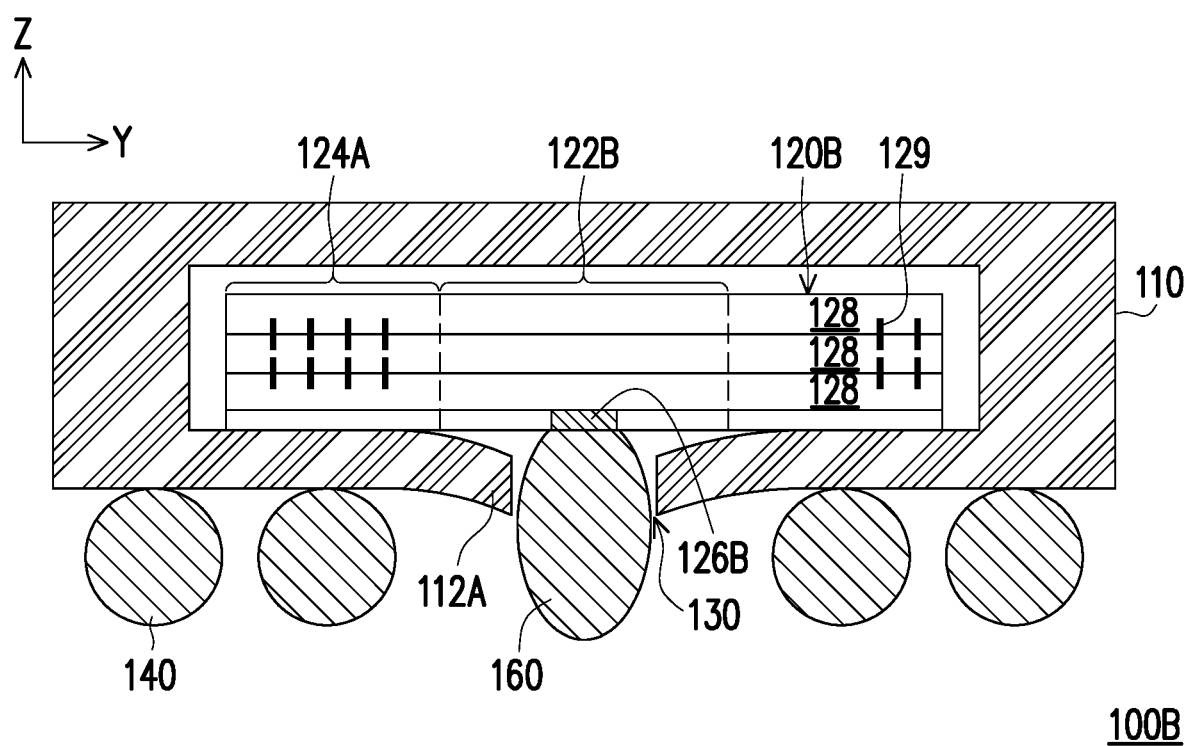
FIG. 5 schematically illustrates a cross-sectional view of a semiconductor package in accordance with some embodiments of the disclosure.

FIG. 5 schematically illustrates a cross-sectional view of a semiconductor package in accordance with some embodiments of the disclosure, wherein the cross-sectional view of FIG. 5 is corresponding to line A-A in FIG. 1. A semiconductor package 100B depicted in FIG. 5 is similar to the semiconductor package 100A in FIG. 3. Specifically, the semiconductor package 100B includes a shielding housing 110 and a semiconductor chip 120B and is different from the semiconductor package 100A in the semiconductor chip 120B. Similar to the previous embodiment, the shielding housing 110 of the semiconductor package 100B has an opening 130 exposing a portion of the semiconductor chip 120B and the semiconductor package 100B also includes bonding bumps 140 for connecting to an external component/device. In addition, the semiconductor package 120B further includes a connector 160 that is connected to the semiconductor chip 120B.

In the embodiment, the semiconductor chip 120B has a first region 122B corresponding to the opening 130 of the shielding housing 110 and a second region 124B beside the first region 122B. The semiconductor chip 120B includes one or more I/O pad 126B connected to the connector 160 for transmitting signals to and from the semiconductor chip 120B. In addition, the semiconductor chip 120B can further include a plurality of silicon substrates 128 stacking in the vertical direction and a plurality of through silicon vias 129 connected between adjacent ones of the silicon substrates 128. In the embodiments, a plurality of MRAM bits (or MRAM cells, not shown) and/or other circuitry components are formed in the silicon substrates 128 and thus the semiconductor chip 120B can be known as a MRAM chip stack. In addition, the MRAM bits are positioned in the second region 124B of the semiconductor chip 120B so that the MRAM bits are shielded by the shielding housing 110. In the embodiment, the connector 160 can be a micro bump that has a ball-like shape, but the disclosure is not limited thereto.

Similar to the previous embodiments, the opening 130 of the shielding housing 110 exposes the first region 122B of the semiconductor chip 120B so that the required signals of the semiconductor chip 120B can be transmitted to and from the semiconductor chip 120B through the I/O pad 126B exposed by the opening 130 and the connector 160 positioned in the opening 130. In addition, the shielding housing 110 has a raised portion 112A around the opening 130 that protruded away from the semiconductor chip 120B. When suffering to an external magnetic field existing in the environment, the line of magnetic field distributed the shielding housing 110 would spreads at the terminal of the raised portion 112A and be directed outwards the semiconductor chip 120A. Accordingly, the influence of the external magnetic field existing in the environment on the semiconductor chip 120B is mitigated, which helps to improve the magnetic immunity of the semiconductor chip 120B.

Figure 6:
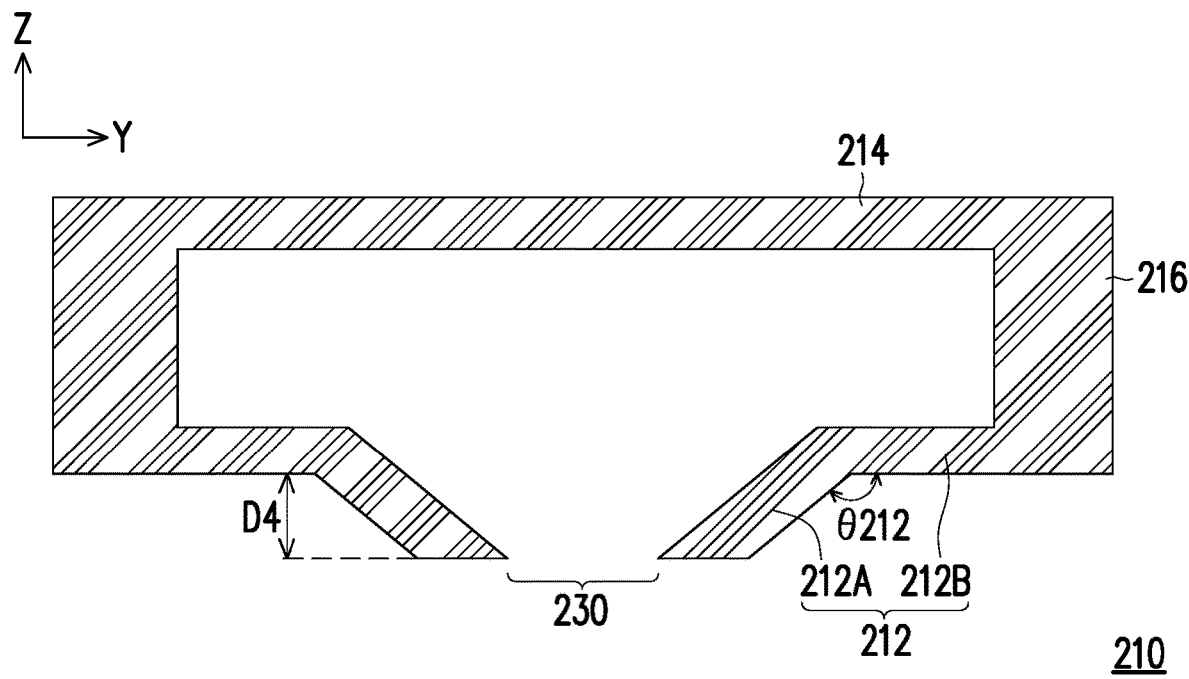
FIG. 6 schematically illustrates a cross-sectional view of a shielding housing for a semiconductor package in accordance with some embodiments.

FIG. 6 schematically illustrates a cross-sectional view of a shielding housing for a semiconductor package in accordance with some embodiments. A shielding housing 210, as shown in the cross-sectional view taken along Y-Z plane, includes a first shielding plate 212, a second shielding plate 214 and a shielding wall 216. The first shielding plate 212 and the second shielding plate 214 are arranged opposite to each other in a bottom and top manner. The shielding wall 216 is arranged along a close loop in top/bottom view and connected between the first shielding plate 212 and the second shielding plate 214. The first shielding plate 212 has an opening 230 and the second shielding plate 214 and the shielding wall 216 are both solid parts without an opening, a slot or the like. The shielding housing 210 can be an alternative of the shielding housing 110 in the previous embodiments and can be applicable in any of the semiconductor packages 100, 100A and 100B.

In the embodiment, the first shielding plate 212 includes a raised portion 212A and a flat portion 212B. The raised portion 212A is arranged around the opening 230 and the edge of the raised portion 212A defines the opening 230. The flat portion 212B is arranged beside the raised portion 212A. The raise portion 212A is connected to the flat portion 212B in a one-piece form. The raised portion 212A has a flat structure that is oblique with respect to the flat portion 212B. The raised portion 212A is bent relative to the flat portion 212B at an angle θ212 and the angle θ212 can be greater than 90 degrees and smaller than 180 degrees. An outer surface of the raised portion 212A and an outer surface of the flat portion 212B are spaced by a distance D4. Accordingly, the outer surface of the raised portion 212A is further away from the second shielding plate 214 than the outer surface of the flat portion 212B. In some embodiments, the distance D4 ranges from 200 μm to 5 mm.

Figure 7:
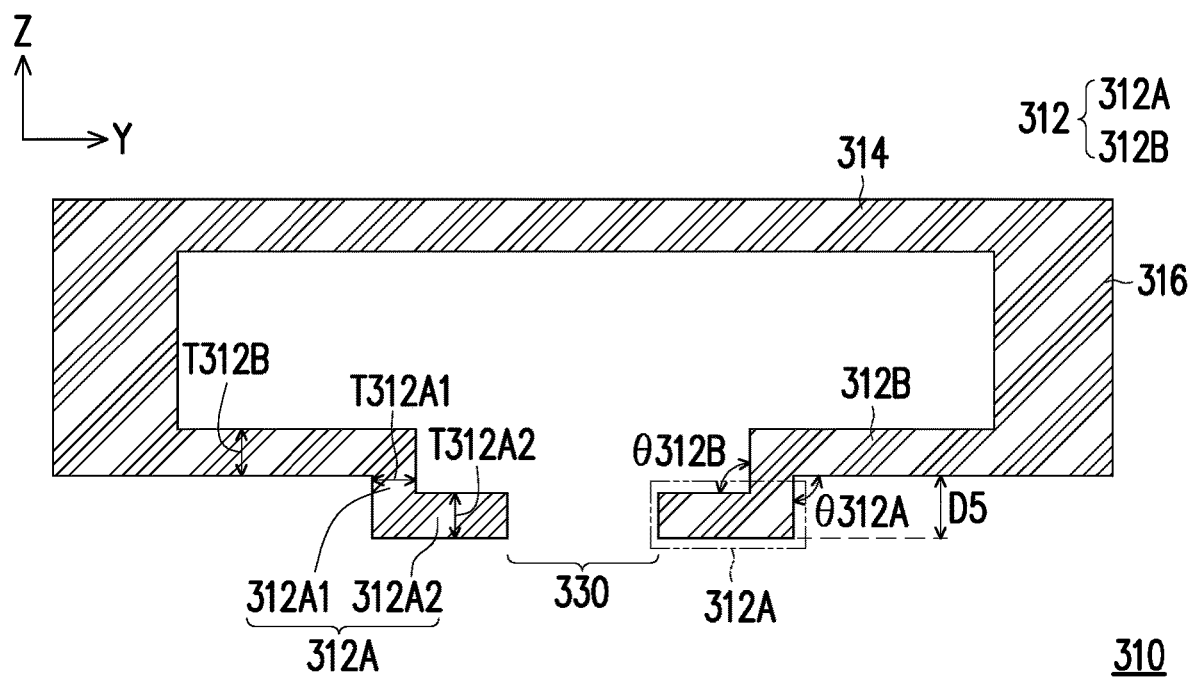
FIG. 7 schematically illustrates a cross-sectional view of a shielding housing for a semiconductor package in accordance with some embodiments.

FIG. 7 schematically illustrates a cross-sectional view of a shielding housing for a semiconductor package in accordance with some embodiments. A shielding housing 310, as shown in the cross-sectional view taken along Y-Z plane, includes a first shielding plate 312, a second shielding plate 314 and a shielding wall 316. The first shielding plate 312 and the second shielding plate 314 are arranged opposite to each other in a bottom and top manner. The shielding wall 316 is arranged along a close loop path (in top view) and connected between the first shielding plate 312 and the second shielding plate 314. The first shielding plate 312 has an opening 330, and the second shielding plate 314 and the shielding wall 316 are both solid parts without an opening, a slot or the like. The shielding housing 310 can be an alternative of the shielding housing 110 in the previous embodiments and can be applicable in any of the semiconductor packages 100, 100A and 100B.

The first shielding plate 312 and the second shielding plate 314 are plate-like parts and the shielding wall 316 extends in the Z direction along the periphery of the second shielding plate 314 and the periphery of the first shielding plate 312. The first shielding plate 312 includes a raised portion 312A and a flat portion 312B that is beside the raised portion 312A. Specifically, an outer surface of the raised portion 312A is further away from the second shielding plate 314 than an outer surface of the flat portion 312A.

The raised portion 312A of the first shielding plate 312 includes a first part 312A1 and a second part 312A2. The first part 312A1 is connected between the flat portion 312B and the second part 312A2 and extends in Z direction. The second part 312A2 is connected at a terminal of the first part 312A1 further away from the second shielding plate 314 and extends in Y direction such that the raised portion 312A and the flat portion 312B form a stair structure. In the embodiment, the raised portion 312 includes two pieces arranged at two opposite sides of the opening 330. The second part 312A2 of a first piece directs toward the second part 312A2 of a second piece and the second parts 312A2 of both pieces are further away from the second shielding plate 314. Accordingly, the first shielding plate 312 keeps a further distance from the second shielding plate 314 at the opening 330 than other portion of the first shielding plate 312.

The first part 312A1 of the raised portion 312A has a thickness T312A1 measured in Y direction. The second part 312A2 of the raised portion 312A has a thickness T312A1 measured in Z direction. The flat portion 312B has a thickness T312B measured in Z direction. In some embodiments, the thickness T312A1, the thickness T312A2 and the thickness T312B can be identical. In some alternative embodiments, one of the thickness T312A1, the thickness T312A2 and the thickness T312B may be different from the others of the thickness T312A1, the thickness T312A2 and the thickness T312B. Alternatively, the thickness T312A1, the thickness T312A2 and the thickness T312B may be different from each other. The outer surface of the raised portion 312A and the outer surface of the flat portion 312B form a stair structure and an inner surface of the raised portion 312A and an inner surface of the flat portion 312B also form a stair structure, but the disclosure is not limited thereto. In addition, the first part 312A1 of the raised portion 312A is bent relative to the flat portion 312B at an angle θ312A and the second part 312A2 of the raised portion 312A is bent relative to the first part 312A1 of the raised portion 312A at an angle θ312B. The angle θ312A and the angle θ312B can be identical or different and can be smaller than 180 degrees and greater than 0 degree so as to form the stair structure.

Figure 8:
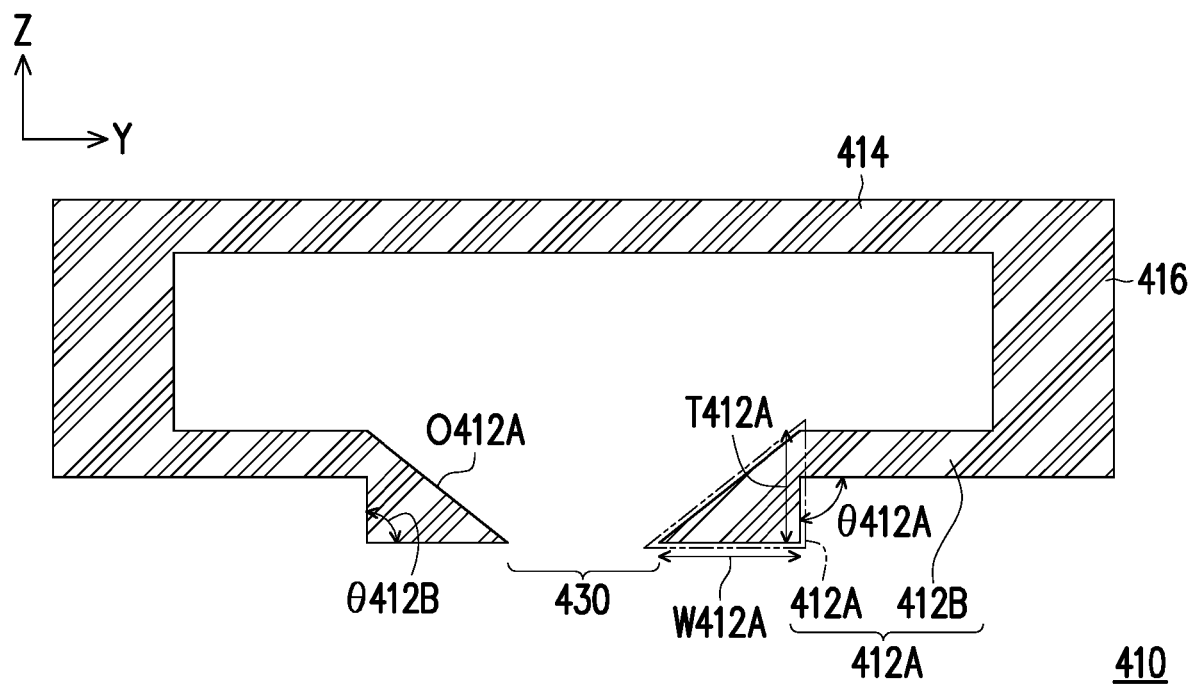
FIG. 8 schematically illustrates a cross-sectional view of a shielding housing for a semiconductor package in accordance with some embodiments.

FIG. 8 schematically illustrates a cross-sectional view of a shielding housing for a semiconductor package in accordance with some embodiments. A shielding housing 410, as shown in the cross-sectional view taken along Y-Z plane, includes a first shielding plate 412, a second shielding plate 414 and a shielding wall 416. The first shielding plate 412 and the second shielding plate 414 are arranged opposite to each other in a bottom and top manner. The shielding wall 416 is arranged along a close loop path (in top view) surrounding the first shielding plate 412 and the second shielding plate 414, and connected between the first shielding plate 412 and the second shielding plate 414. The first shielding plate 412 has an opening 430. The second shielding plate 414 and the shielding wall 416 are both solid parts without an opening, a slot or the like. The shielding housing 410 can be an alternative of the shielding housing 110 in the previous embodiments and can be applicable in any of the semiconductor packages 100, 100A and 100B. Specifically, the structures of the second shielding plate 414 and the shielding wall 416 are substantially the same as the second shielding plate 114 and the shielding wall 116 depicted in FIGS. 1 to 4, and thus are not reiterated herein.

The first shielding plate 412 includes a raised portion 412A and a flat portion 412B beside the raised portion 412A. The flat portion 412B extends, for example in the Y direction, from the terminal of the shielding wall 416 toward the opening 430. The raised portion 412A is connected to the distal terminal of the flat portion 412B away from the shielding wall 416. The raised portion 412A has a variant thickness. The raised portion 412A can have an oblique inner surface O412A that gradually further away from the second shielding plate 414 from the end connected to the flat portion 412B. The raised portion 412A has a thickness T412A measured in Z direction and a width W412A measured in Y direction. The thickness T412A is gradually reduced outwardly from the end connected to the flat portion 412B. The width W412A is gradually increased outwardly from the end connected to the flat portion 412B. An outer surface of the raised portion 412A can be intersected with an outer surface of the flat portion 412B by an angle θ412A and the outer surface of the raised portion 412A can turn at an angle θ412B. The angle θ412A and the angle θ412B can be the same or different and can be smaller than 180 degrees and greater than 0 degree. The outer surface of the raised portion 412A is further away from the second shielding plate 414 than the outer surface of the flat portion 412B. Specifically, as shown in FIG. 8, the raised portion 412A can have a triangular shape, but the disclosure is not limited thereto.

Figure 9:
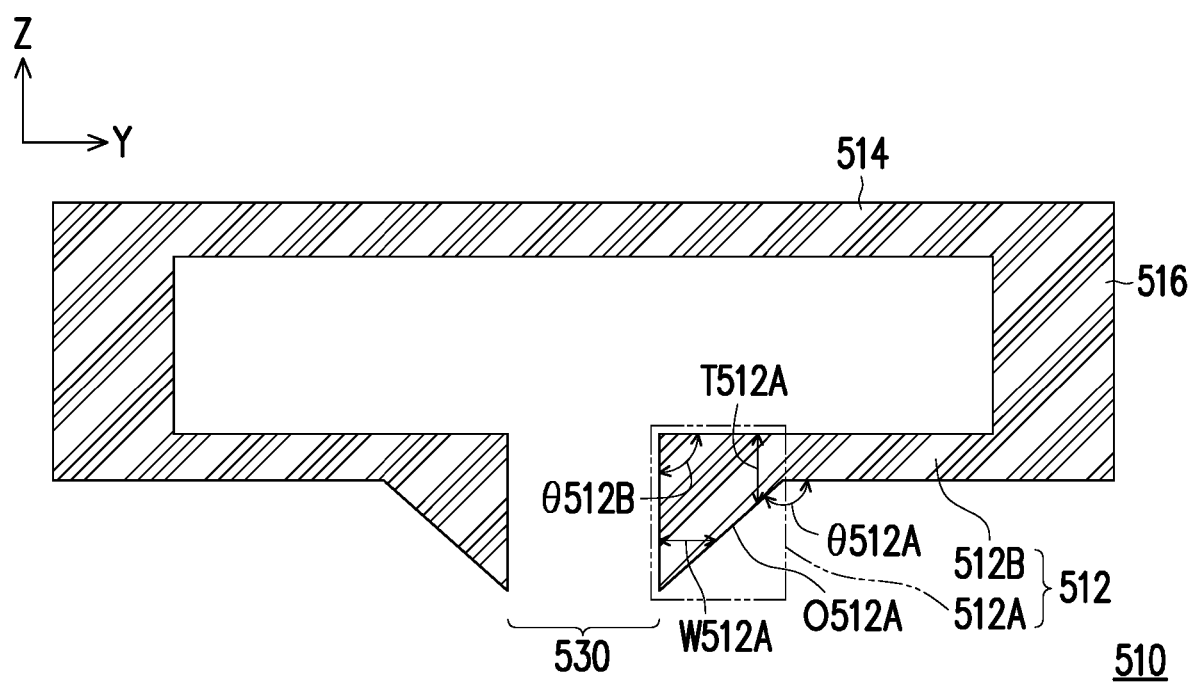
FIG. 9 schematically illustrates a cross-sectional view of a shielding housing for a semiconductor package in accordance with some embodiments.

FIG. 9 schematically illustrates a cross-sectional view of a shielding housing for a semiconductor package in accordance with some embodiments. A shielding housing 510, as shown in the cross-sectional view taken along Y-Z plane, includes a first shielding plate 512, a second shielding plate 514 and a shielding wall 516. The first shielding plate 512 and the second shielding plate 514 are arranged opposite to each other in a bottom and top manner, i.e. in the Z direction. The shielding wall 516 is arranged along a close loop path (in top view) surrounding the first shielding plate 512 and the second shielding plate 514, and connected between the first shielding plate 512 and the second shielding plate 514. The first shielding plate 512 has an opening 530. The second shielding plate 514 and the shielding wall 516 are both solid parts without an opening, a slot or the like. The shielding housing 510 can be an alternative of the shielding housing 110 in the previous embodiments and can be applicable in any of the semiconductor packages 100, 100A and 100B. Specifically, the structures of the second shielding plate 514 and the shielding wall 516 are substantially the same as the second shielding plate 114 and the shielding wall 116 depicted in FIGS. 1 to 4, and thus are not reiterated herein.

The first shielding plate 512 includes a raised portion 512A surrounding the opening 530 and a flat portion 512B beside the raised portion 512A. The flat portion 512B extends in Y direction from the terminal of the shielding wall 516 toward the opening 530. The raised portion 512A is connected to a terminal of the flat portion 512B away from the shielding wall 516. The raised portion 512A has a variant thickness. The raised portion 512A can have an oblique outer surface O512A that is tilt gradually further away from the second shielding plate 514 from the end connected to the flat portion 512B. Therefore, the outer surface, i.e. the oblique outer surface O412A, of the raised portion 512 is further away from the second shielding plate 514 than an outer surface of the flat portion 412B.

The raised portion 512A has a thickness T512A measured in Z direction and a width W512A measured in Y direction. The thickness T512A is gradually increased outwardly from the end connected to the flat portion 512B. The width W512A is gradually reduced outwardly from the end connected to the flat portion 512B. An inner surface of the raised portion 512A can be arranged as the same level as an inner surface of the flat portion 512B. In some embodiments, when the shielding housing 510 is applied to the semiconductor package 100 shown in FIG. 1, the semiconductor chip 120 can be leant against the inner surface of the raised portion 512A. The oblique outer surface O512A of the raised portion 512A can be intersected with the outer surface of the flat portion 512B by an angle θ512A and the inner surface of the raised portion 512A can turn at an angle θ512B around the opening 430. The angle θ512A can be smaller than 180 degrees and greater than 0 degree and the angle θ512B can be smaller than 180 degrees and greater than 90 degree.

In the embodiments of FIGS. 3-9, the shielding housings 110, 210, 310, 410 and 510 are made of a magnetic permeable material. In some embodiments, the material of the shielding housings 110, 210, 310, 410 and 510 has a magnetic permeability (μ) of greater than 10 while the air or a vacuum space presents the magnetic permeability of 1. The material of the shielding housings 110, 210, 310, 410 and 510 can be selected from one or more of NiFe, CoFe, NiCuZn, MnZn, Si steel, or the like. In addition, the shielding housings 110, 210, 310, 410 and 510 can also have high saturation magnetization (Bs).

Figure 10:
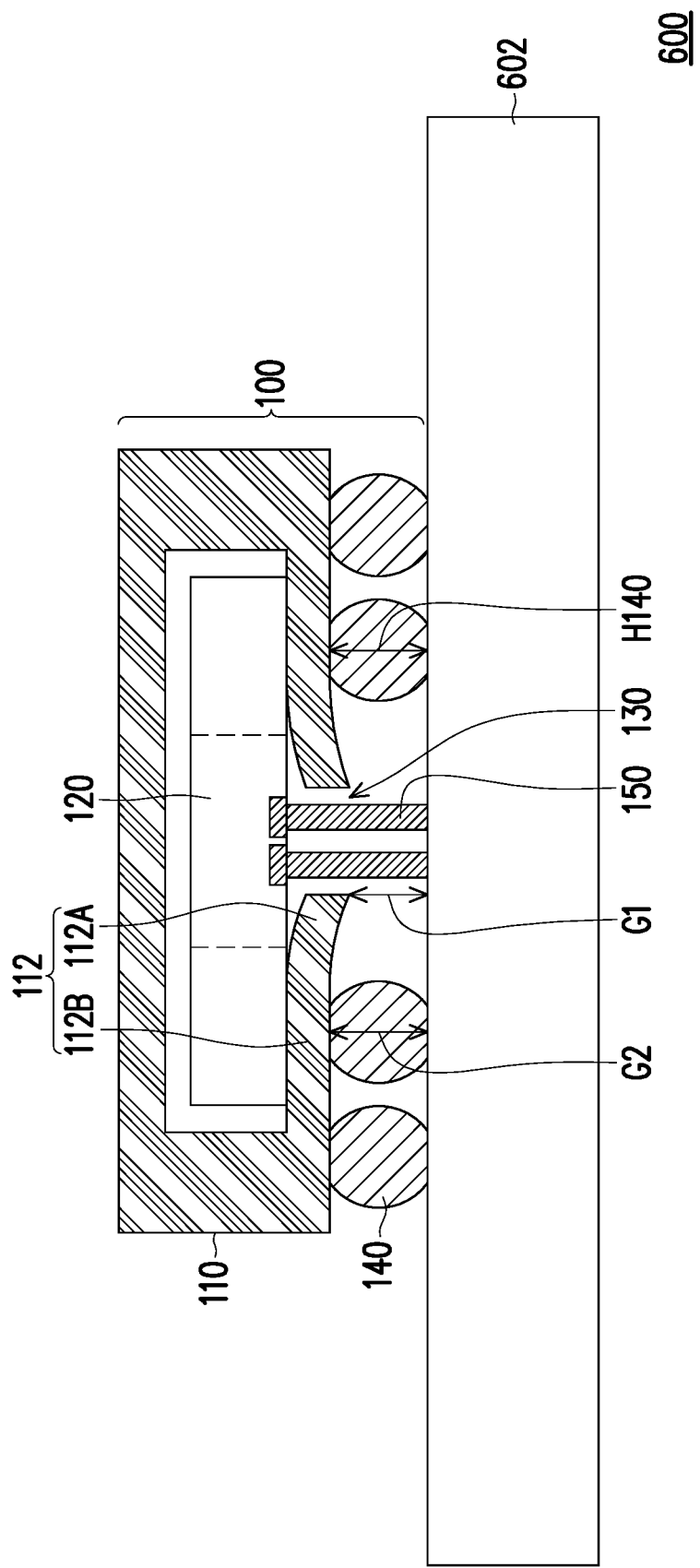
FIG. 10 schematically illustrates a cross-sectional view of a semiconductor device in accordance with some embodiments of the disclosure.

FIG. 10 schematically illustrates a cross-sectional view of a semiconductor device in accordance with some embodiments of the disclosure. A semiconductor device 600 includes a substrate 610 and a semiconductor package 100 connected to the substrate 602. The semiconductor package 100 is similar to the semiconductor package 100 depicted in FIGS. 1 and 2 and thus the details of the semiconductor package 100 can refer to the previous embodiments. In addition, the semiconductor package 100 can be replaced by any of the semiconductor package 100A and the semiconductor package 100B.

The semiconductor package 100 includes a shielding housing 110, a semiconductor chip 120 encased by the shielding housing 110 and one or more bonding bump 140 disposed at an outer surface of the shielding housing 110. The semiconductor package 100 is connected to the substrate 602 by bonding the bonding bump 140 onto the substrate 602. The shielding housing 110 has an opening 130 exposing a portion of the semiconductor chip 120, and one or more connector 150 is arranged in the opening 130 for connecting between the semiconductor chip 120 and the substrate 602. In some embodiments, the substrate 602 can be a circuit substrate, for example, a printed circuit board (PCB) or the like. The connector 150 provides electrical transmission path between the semiconductor chip 120 and the substrate 602. In some embodiments, the connector 150 can be a bonding wire as depicted in FIG. 3.

Referring to FIG. 1 and FIG. 10, the shielding housing 110 includes the first shielding plate 112, the second shielding plate 114 and the shielding wall 116. The first shielding plate 112 has the raised portion 112A and the flat portion 112B. For illustration purpose, the reference numbers of 114 and 116 are omitted from FIG. 10. In the embodiment, the raised portion 112A keeps a first gap G1 from the substrate 602 and the first gap G1 is smaller than the height H140 of the bonding bump 140. In addition, the flat portion 112B keeps a second gap G2 from the substrate 602 and the first gap G1 is smaller than the second gap G2. Specifically, the second gap G2 can be identical to the height H140 of the bonding bump 140. The shielding housings 110, 210, 310, 410 and 510 depicted in the previous embodiments can be applicable to the semiconductor package 100 for implementing the structure of the raised portion 112A.

In the embodiment, the opening 130 of the shielding housing 110 exposes a region of the semiconductor chip 120 and the semiconductor chip 120 includes one or more I/O pad in the exposed region. Therefore, the connector 150 is connected to the I/O pad for transmitting the required signals between the semiconductor chip 120 and the substrate 602. In other words, the I/O pad of the semiconductor chip 120 is exposed by the opening 130 of the shielding housing 110. In addition, the semiconductor chip 120 can further include memory cells, such as MRAM cells or MRAM bits, in a region that is shielded by the shielding housing 110. In light of the shielding housing 110, the magnetic field in the environment where the semiconductor device 600 is placed would be redirected without passing through the semiconductor chip 120 directly, which mitigates the unwanted influence of the magnetic field in the environment on the performance of the semiconductor chip 120. In addition, the raised portion 112A around the opening 130 further helps directing the magnetic field in the environment away from the semiconductor chip 120 as described in above. Therefore, the opening 130 of the shielding housing 110 allows the transmission of electrical signals without causing a magnetic shielding breach. Under the shielding of the shielding housing 110, the magnetic immunity of the semiconductor chip 120 is improved so that the performance of the semiconductor chip 120 is ensured and the design room of the semiconductor chip 120 is broadened.

Figure 11:
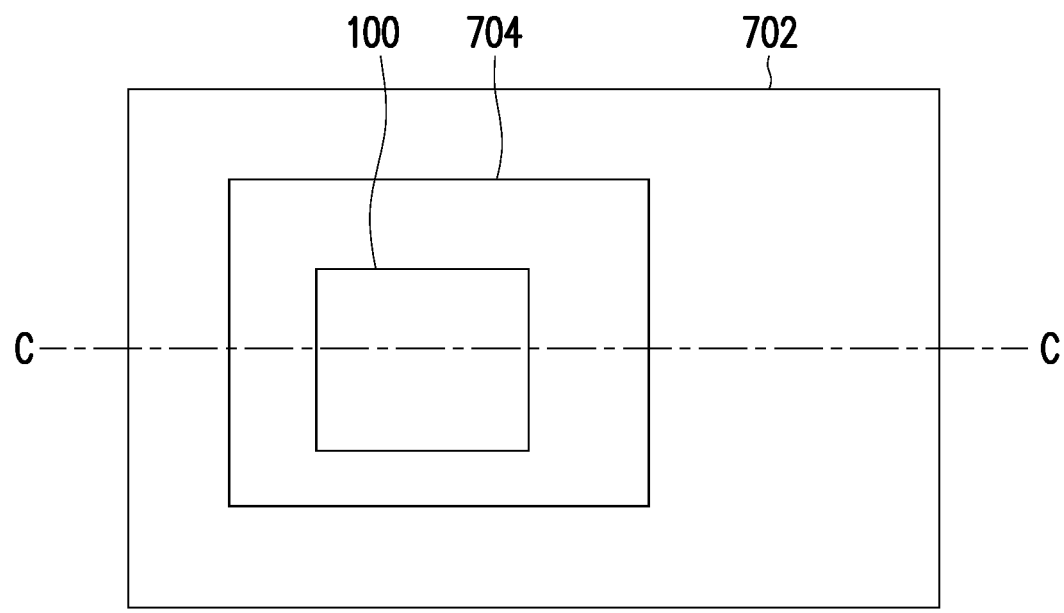
FIG. 11 and FIG. 12 schematically illustrate a top view and a cross-sectional view of a semiconductor device in accordance with some embodiments of the disclosure.
Figure 12:
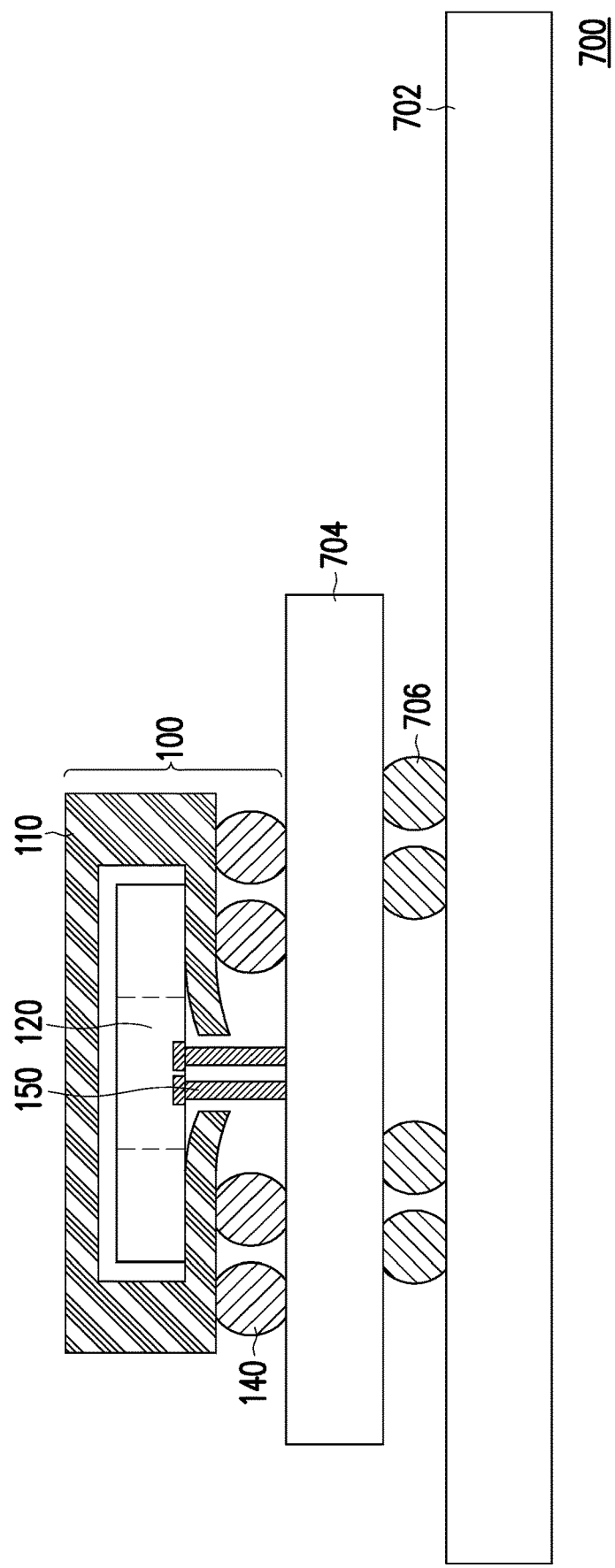

FIG. 11 and FIG. 12 schematically illustrate a top view and a cross-sectional view of a semiconductor device in accordance with some embodiments of the disclosure. A semiconductor device 700 includes a semiconductor package 100, a substrate 702 and an interposer 704. The semiconductor package 100 is connected to the substrate 702 through the interposer 704. Namely, the interposer 704 is interposed between the substrate 702 and the semiconductor package 100. The details of the semiconductor package 100 can refer to the previous embodiments and are not reiterated herein. The semiconductor package 100 can be connected to the interposed 704 through the bonding bump 140 between the shielding housing 110 and the interposer 704 and through the connector 150 between the semiconductor chip 120 and the interposer 704. In other words, the bonding bump 140 and the connector 150 are connected to the interposer 704. In addition, the interposer 704 is connected to the substrate 702 through one or more bonding bump 706. The bonding bump 706 and the bonding bump 140 may be solder balls or the like. The interposed 704 include one or more through substrate via that enables the electrical transmission from one side of the interposer 704 to an opposite side of the interposer 704 so that the electrical signal can be transmitted between the semiconductor chip 120 and the substrate 702.

From top view as shown in FIG. 11, the size of the semiconductor package 100 is smaller than the size of the interposer 704 that is smaller than the size of the substrate 702, but the disclosure is not limited thereto. The size of the interposer 704 can be the same as or smaller than the size of the semiconductor package 100 in some alternative embodiments. The semiconductor package 100 can be replaced by the semiconductor package 100B as depicted in FIG. 5 so that the semiconductor chip 120B in the semiconductor package 100 is connected to the interposer 704 through the connector 160, e.g. a micro bump.

In the according to some embodiments of the disclosure, a shielding housing has an opening and a raised portion around the opening. In addition, the shielding housing has desirable magnetic permeability. Therefore, the shielding housing can provide required magnetic shielding effect for a semiconductor chip. Specifically, the semiconductor package using the shielding housing to encase the semiconductor chip can have improved magnetic immunity. The semiconductor chip can present desirable performance and especially when the semiconductor chip is a memory chip.

In accordance with some embodiments, a semiconductor package can include a semiconductor chip having a first region and a second region beside the first region; and a shielding housing encasing the semiconductor chip, made of a magnetic permeable material, and comprising a first shielding plate, a second shielding plate opposite to the first shielding plate and a shielding wall extending between the first shielding plate and the second shielding plate, wherein the first shielding plate has an opening exposing the first region and comprises a raised portion surrounding the opening and a flat portion beside the raised portion and shielding the second region, and a first distance from a level of the semiconductor chip to an outer surface of the raised portion is greater than a second distance from the level of the semiconductor chip to an outer surface of the flat portion. A difference between the first distance and the second distance ranges from 200 μm to 5 mm. A bonding bump is further attached to the outer surface of the flat portion. A difference between the first distance and the second distance is smaller than a height of the bonding bump. The raised portion is arranged at opposite sides of the opening. The first shielding plate, the second shielding plate and the shielding wall are made of a common material. The semiconductor chip is spaced from the raised portion of the first shielding plate and is leant against the flat portion of the first shielding plate. The semiconductor chip includes an I/O pad located in the first region. A connector is further positioned in the opening and connected to the I/O pad.

In accordance with some embodiments, a semiconductor device includes a substrate; a semiconductor package connected to the substrate and comprising a shielding housing made of a magnetic permeable material and a semiconductor chip encased by the shielding housing, wherein the shielding housing comprises a first shielding plate, a second shielding plate opposite to the first shielding plate and a shielding wall extending between the first shielding plate and the second shielding plate, the first shielding plate has an opening and comprises a raised portion surrounding the opening and a flat portion beside the raised portion; and a bonding bump disposed between the substrate and the flat portion, wherein the raised portion keeps a first gap from the substrate, a height of the bonding bump is greater than the first gap. The flat portion keeps a second gap from the substrate and the first gap is smaller than the second gap. The semiconductor chip comprises an I/O pad exposed by the opening. The semiconductor package further includes a connector positioned in the opening and connected between the I/O pad and the substrate. The substrate is an interposer.

In accordance with some embodiments, a shielding housing of a semiconductor package includes a first shielding plate, having an opening, and comprising a raised portion surrounding the opening and a flat portion beside the raised portion; a second shielding plate opposite to the first shielding plate, wherein an outer surface of the raised portion is further away from the second shielding plate than an outer surface of the flat portion; and a shielding wall extending between the first shielding plate and the second shielding plate. The raised portion is bent with respect to the flat portion. The raised portion and the flat portion form a stair structure. A thickness of the raised portion is greater than a thickness of the flat portion. The raised portion has a variant thickness gradually changed in a direction outwards from the flat portion. The raised portion has an oblique surface gradually further away from the second shielding plate from an end connected to the flat portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor chip comprises an I/O pad;
   a shielding housing encasing the semiconductor chip, and having an opening exposing the I/O pad, wherein the shielding housing comprises a raised portion surrounding the opening and a flat portion beside the raised portion, and wherein the raised portion is between the opening and the flat portion, keeps a further distance from the semiconductor chip than the flat portion, and keeps an air space from a bottom of the semiconductor chip;
   a connector positioned in the opening of the shielding housing and connected to the I/O pad; and
   a bonding bump attached to and in contact with an outer surface of the flat portion.

2. The semiconductor package of claim 1, wherein the further distance ranges from 200 μm to 5 mm.

3. The semiconductor package of claim 1, wherein the further distance is smaller than a height of the bonding bump.

4. The semiconductor package of claim 1, wherein the raised portion of the shielding housing is arranged along opposite sides of the opening and the flat portion comprises first and second inner edges arranged along another opposite sides of the opening.

5. The semiconductor package of claim 1, wherein the shielding housing is made of a magnetic permeable material.

6. The semiconductor package of claim 1, wherein the semiconductor chip is spaced from the raised portion of the shielding housing and is leant against the flat portion of the shielding housing.

7. The semiconductor package of claim 1, wherein the I/O pad is located in a central region of the semiconductor chip.

8. The semiconductor package of claim 1, wherein the raised portion is bent with respect to the flat portion.

9. The semiconductor package of claim 1, wherein the raised portion has an oblique surface gradually further away from the semiconductor chip from an end connected to the flat portion.

10. A semiconductor device, comprising:
    a substrate;
    a semiconductor package connected to the substrate and comprising a shielding housing and a semiconductor chip encased by the shielding housing, wherein the semiconductor chip comprises an I/O pad and the shielding housing comprises a raised portion exposing the I/O pad and a flat portion beside the raised portion, and wherein the raised portion is between the I/O pad and the flat portion and keeps an air space from a bottom of the semiconductor chip;
    a connector connected between the I/O pad and the substrate; and
    a bonding bump disposed between the substrate and the flat portion of the shielding housing and in contact with an outer surface of the flat portion, wherein the raised portion of the shielding housing keeps a first gap from the substrate, the flat portion of the shielding housing keeps a second gap from the substrate, and the first gap is smaller than the second gap.

11. The semiconductor device of claim 10, wherein the shielding housing is made of a magnetic permeable material.

12. The semiconductor device of claim 10, wherein the I/O pad is located in a central region of the semiconductor chip.

13. The semiconductor device of claim 10, wherein the connector is higher than the bonding bump in a direction extending between the I/O pad and the substrate.

14. The semiconductor device of claim 10, wherein the substrate is an interposer.

15. A shielding housing of a semiconductor package, comprising:
    a first shielding plate comprising a raised portion and a flat portion beside the raised portion, wherein the flat portion has a first inner edge and a second inner edge opposite to the first inner edge to define an opening, and the raised portion is between the first inner edge and the second inner edge and protruded from the flat portion in a thickness direction;
    a second shielding plate opposite to the first shielding plate, wherein the flat portion is substantially parallel to the second shielding plate while the raised portion is not; and
    a shielding wall extending between the first shielding plate and the second shielding plate, wherein the first shielding plate, the second shielding plate and the shielding wall are in a one-piece form.

16. The shielding housing of the semiconductor package of claim 15, wherein the raised portion of the first shielding plate is bent with respect to the flat portion of the first shielding plate.

17. The shielding housing of the semiconductor package of claim 15, wherein the raised portion of the first shielding plate and the flat portion of the first shielding plate form a stair structure.

18. The shielding housing of the semiconductor package of claim 15, wherein a thickness of the raised portion of the first shielding plate is greater than a thickness of the flat portion of the first shielding plate.

19. The shielding housing of the semiconductor package of claim 15, wherein the raised portion of the first shielding plate has a variant thickness gradually changed in a direction outwards from the flat portion of the first shielding plate.

20. The shielding housing of the semiconductor package of claim 15, wherein the raised portion of the first shielding plate has an oblique surface gradually further away from the second shielding plate from an end connected to the flat portion of the first shielding plate.

* * * * *